United States Patent
Feiertag et al.

(10) Patent No.: US 6,909,183 B2
(45) Date of Patent: Jun. 21, 2005

(54) SUBSTRATE FOR AN ELECTRIC COMPONENT AND METHOD FOR THE PRODUCTION THEREOF

(75) Inventors: Gregor Feiertag, München (DE); Alois Stelzl, München (DE); Hans Krüger, München (DE)

(73) Assignee: Epcos AG, Münich (DE)

( * ) Notice: Subject to any disclaimer, the term of this patent is extended or adjusted under 35 U.S.C. 154(b) by 0 days.

(21) Appl. No.: 10/470,117

(22) PCT Filed: Jan. 21, 2002

(86) PCT No.: PCT/DE02/00180
§ 371 (c)(1),
(2), (4) Date: Jul. 25, 2003

(87) PCT Pub. No.: WO02/061833
PCT Pub. Date: Aug. 8, 2002

(65) Prior Publication Data
US 2004/0058473 A1 Mar. 25, 2004

(30) Foreign Application Priority Data
Feb. 1, 2001 (DE) .......................... 101 04 574

(51) Int. Cl.⁷ ............................................. H01L 23/48
(52) U.S. Cl. ...................................... 257/737; 257/778
(58) Field of Search ................................. 257/737, 738, 257/778

(56) References Cited

U.S. PATENT DOCUMENTS

| | | | |
|---|---|---|---|
| 5,904,563 A | 5/1999 | Yu | |
| 6,570,469 B2 * | 5/2003 | Yamada et al. | 333/193 |
| 6,743,534 B2 * | 6/2004 | Lautzenhiser et al. | 428/701 |

OTHER PUBLICATIONS

Donnay et al, "Chip–Package Codesign of a Low–Power 5–GHz RF Front End", *Proceedings of the IEEE*, vol. 88, No. 10, Oct. 2000, pp. 1583–1597.
Baier, "Akustische Oberflächenwellenfilter–Schrittmacher der passiven Integration", *Elektronik Industrie–Bauelemente*, Oct. 2000, pp. 48–51.
Wong et al, "Low Cost Flip Chip Bumping Technologies" *1997 IEEE/CPMT Electronic Packaging Technology Conference*, Oct. 8, 1997, pp. 244–250.
Jung et al, "Integration of Flip Chip Assembly in the SMT Process: Manufacturing an Productivity Issues", *1998 IEEE/CPMT Int'l Electronics Manufacturing Technology Symposium*, Oct. 19, 1998, pp. 8–15.

* cited by examiner

Primary Examiner—Roy Potter
(74) Attorney, Agent, or Firm—Schiff Hardin LLP

(57) ABSTRACT

For a component mounted with the flip-chip technique, in particular surface wave elements, it is proposed to use a low-shrinkage ceramic substrate over which (as needed) multi-layer metallizations are produced by metal deposition. The bumps can also be produced by self-aligning metal deposition.

7 Claims, 2 Drawing Sheets

SUBSTRATE FOR AN ELECTRIC COMPONENT AND METHOD FOR THE PRODUCTION THEREOF

BACKGROUND OF THE INVENTION

With the help of flip-chip technology, it is possible to affix and bond surface wave components in a simple manner to a carrier (for example, a circuit board), to thereby arrange the component so it is mechanically protected, and to further reduce the size of the entire assembly. In addition, the piezoelectric substrate on which the surface wave element is realized in the metallized form is provided with solderable contacts on the surface. Corresponding cooperating contacts that provide solder pads are on a base plate, for example a ceramic multi-layer plate made from HTCC-ceramic. These solder pads are arranged by feedthroughs or plated through holes in the base plate or connected to it via metallic conductor paths, so that the electrical connection can ensue to the back side of the base plate. With the metallization facing down, the surface wave substrate is now mounted on the base plate and the connection between the solder pads and the solderable contacts on the chip is made with the aid of solder hunches-bumps.

The component structures on the chip thereby remain spaced from the base plate and are mechanically protected in the intervening space formed between chip and base plate. It is also possible to protect the component structures before the mounting of the chips on the base plate with the aid of a covering that, for example, can be generated in an integrated procedure from two-layer materials capable of being photostructured. The component structures are thereby better protected against environmental influences. To further seal the component, it is possible to cover the chip, for example, with a film or a layer that terminates tightly with the base plate. In addition, a radiofrequency shield of the surface wave component is possible with the aid of a metal layer or metal sub-layer.

With increasing miniaturization of surface wave components mounted with the flip-chip technique, the demand for base plates and the assembly technologies used is rising. For example, a larger number of bump connections are needed per unit of area that are often no longer realizable with reasonably priced methods. The application of bumps and conductor paths on the base plate occurs in a cost-effective manner by means of screen printing. Bump separations of up to a minimum of 250 $\mu$m and bump diameters or, respectively, conductor paths of a minimum of 80 $\mu$m can be produced by screen printing. Conductor path widths of a minimum of 80 $\mu$m are produced. If still smaller structures should be produced, an exact alignment of the structures on the base plate is no longer possible. This problem is aggravated in that the feedthroughs of the base plate are already produced in the green film phase of the ceramic. The green film is then transferred into the final hard ceramic by sintering. Admittedly, a shrinkage of the surface area that entails an error of more than 0.2% is associated with commonly used HTCC-ceramic. This makes a precise alignment of the bumps and conductor paths to be printed impossible.

SUMMARY OF THE INVENTION

The object of the present invention is therefore to provide a substrate or, respectively, a base plate for components to which flip-chip technology is applied, in particular surface wave components, for example, surface acoustical wave (SAW) components, in which a precise alignment of the component is possible in further progressive miniaturizations. A further object concerns the production of such a substrate.

The invention proposes to use a ceramic having low warping as a substrate for flip-chip-mounted components, and to produce the required conductor paths and under-bump metallization (solder pads) as necessary on the substrate in the form of a multilayer metallization with the aid of a photostructuring in an additive or subtractive method, and to apply bumps to them.

It is possible with such a substrate to clearly reduce the hitherto lower limit for bump separations of 250 $\mu$m and of bump and conductor path diameters of 80 $\mu$m, so that a further miniaturization of components is possible in a simple manner. For example, components with external dimensions of 5×5 mm$^2$ or better can be produced with the invention. Since the production of bumps can ensue in a quasi-self-aligning manner on an inventively photolithographically produced under-bump metallization, bumps can be produced for the later flip-chip mountings with a distance or spacing of less than 100 $\mu$m. Nevertheless, it is possible with the invention to implement all processing steps with higher alignment precision, so that the component is produced with a greater reliability and with little waste.

The inventively used ceramic having low warping shows a shrinkage during sintering with an error of less than 0.1% which allows, within the range of the allowable tolerance limits, a precise alignment of the metallization on the substrate relative to the feedthroughs formed before the sintering. For example, an especially low-shrinkage ceramic is a selected non-shrinkage LTCC-ceramic (Low Temperature Cofired Ceramic).

A feedthrough conventionally produced by stamping the green film, for example, usually exhibits a diameter of 150 $\mu$m. In exacting methods, feedthroughs with diameters of 100 $\mu$m or even 80 $\mu$m may also be produced. However, since an inventive substrate can comprise bump diameters of less than 75 $\mu$m, it is advantageous to not produce the solder pads directly on the substrate for the definition of the bumps, but rather to realize these in a multilayer assembly which comprises at least one isolation layer over the substrate and at least one electrically conductive layer over the isolated layer. Any wiring patterns and solder geometries may be realized in a simple manner in such multi-layer metallizations. Large-area connection surfaces for contacting the feedthroughs can thus be covered with isolation layers, over which small-surface solder pads with slight distance can then be produced as an under-bump metallization. A compensation that enables smaller bump dimensions and distances is thus allowed for the imprecisions caused in the ceramic substrate.

The isolation layers for the multi-layer metallizations can preferably be photostructured and, especially advantageously, implemented as light-sensitive photoresists. Appropriate base polymers for these isolation layers that can be photostructured can be selected from a polyimide, a polybenzoxazol (PBO), or a benzocylcobutene (BCB), known for high temperature durability. These polymers can be implemented either as negatively operating photoresists, which cross-link in irradiated regions and are thereby insoluble, and which thereby increases their thermal and chemical resistances, or as positive resists whose solubility can be increased by irradiation.

In the additive method, the metallizations are first defined by means of a photoresist or isolation layers that can be photostructured. In addition, a base metallization can first be applied, for example by sputtering or vacuum deposition. This is subsequently covered with a structured resist layer or photoresist layer in which the regions to be metallized are bared. The metallization in the bared regions is isolated from the solution for the thickening-up of the base metallizations. This is suited as well to zero-current as well as galvanic methods that can be used in combination in an advantageous manner. A multi-layer metallization comprises, for example, an adhesive layer or seed layer, a rapidly grown conducting layer, and on top of that normally a passivation layer made from a metal that is oxidation-resistant or which is shows an appropriate passivation by means of a provided thin oxide layer. A range of methods are known for such metallization, however they are not the subject matter of the invention.

In possible methods that are likewise subtractive, the metallizations are first applied by vapor deposition or sputtering over the entire surface in the desired layer thickness, and only afterwards structured, for example by means of etching using a structured resist layer as an etching template.

The exact geometric definition of the metallization in the layer capable of being photostructured is possible by means of an exposure of an image that can be implemented with a correspondingly aligned photomask. However, it is also possible to implement the exposure of the layer capable of being photostructured by means of a scanned laser exposure that can be implemented in a self-aligning manner with the aid of orientation markings on the substrate.

It is possible in an embodiment of the invention to use one or more feedthroughs as alignment markers for the self-aligning scanned laser exposure. This guarantees an exact relative positioning of the metallic structures on the substrate relative to the feedthroughs already previously existing.

The figures serve only for the better understanding of the invention and show no scale images of the component.

DESCRIPTION OF THE PREFERRED EMBODIMENT

Figure 5:
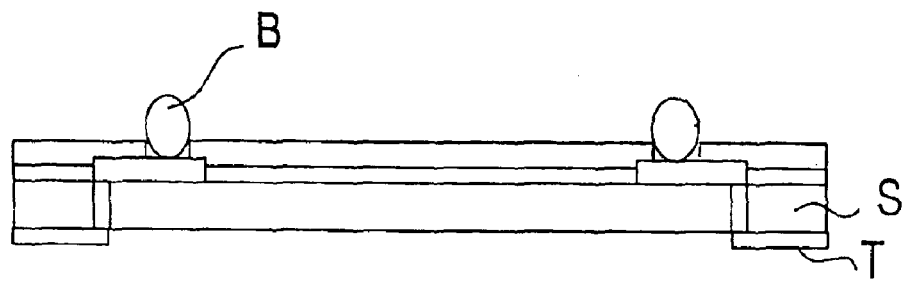
Figure 6:
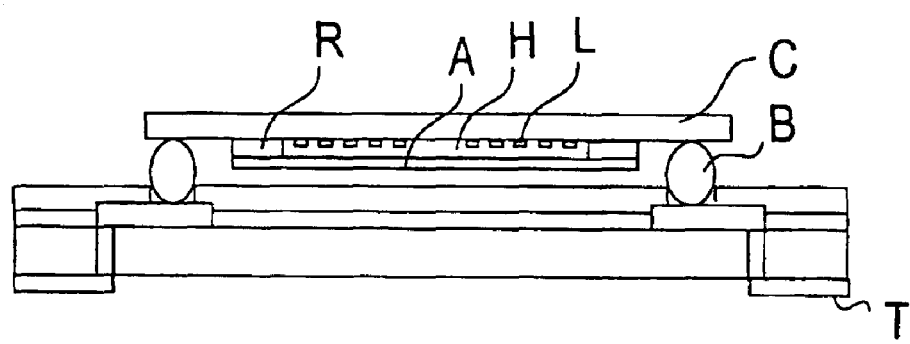
Figure 7:
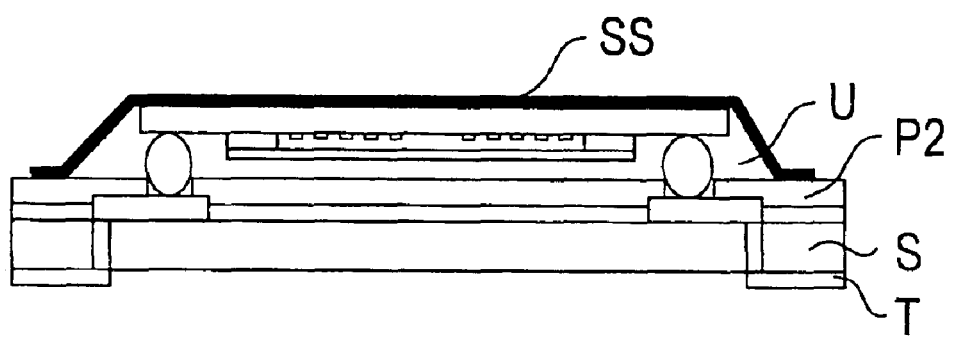

The principles of the present invention are useful in making a surface acoustical wave (SAW) component shown in FIG. 7 by a series of steps shown in FIGS. 1–7.

Figure 1:
FIGS. 1–7 are schematic cross-sectional views showing various method steps in the production of an inventive substrate equipped, for example, with a surface wave component according to the present invention.

For example, a ceramic green film made from an LTCC-material is provided by stamping with feedthroughs or through holes D necessary for external connections. The film is sintered, whereby it exhibits an exactly defined lateral shrinkage of less than 0.1%. FIG. 1 shows the substrate S provided with the feedthroughs D in this state.

Figure 2:
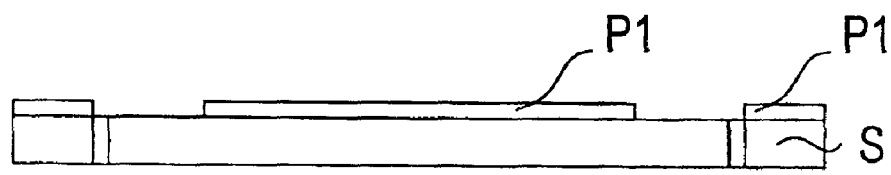
Figure 3:
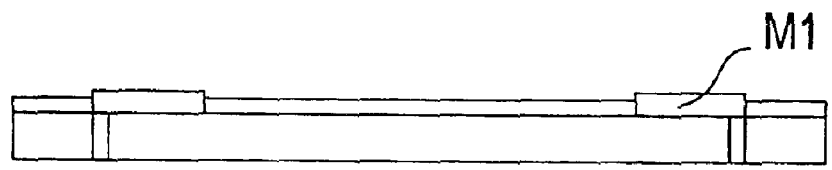

A first layer P1 capable of being photostructured is now applied to the entire surface of the substrate S and is exposed with an image in order to define openings for a first metallization layer. The layer capable of being photostructured, that also serves later as the isolation layer, is removed by developing after the procedure from the locations that are provided for the first metallization M1. FIG. 2 shows the arrangement of the already photostructured layer P1.

A thin metal layer M1 is deposited here for the metallization by means of a zero-current metal deposition and preferably galvanic reinforcement in the regions that are not covered by the first layer P1, namely in the area of the required conductor paths and soldering pads. The thickness of the first metallization layer M1 is determined by appropriate deposition requirements, and its current conductivity is determined together with the metal selection.

Figure 4:
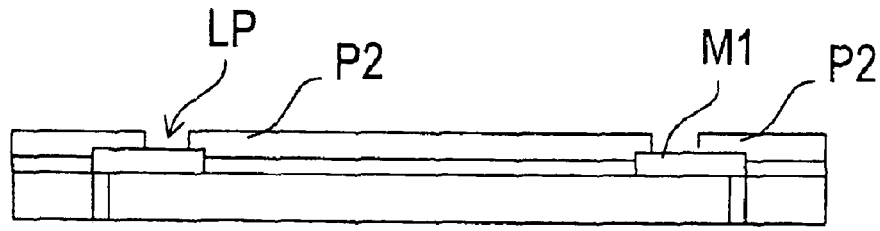

A second layer P2 capable of being photostructured is now applied over the entire surface of the assembly. The surfaces in the first metallization layer M1 are bared by photostructuring the second layer P2 to expose the soldering pads LP for acceptance of the bumps, thus the under-bump metallization. FIG. 4 shows the arrangement of the first metallization layer M1 after baring the regions prepared as solder pads LP.

The bumps B are now produced over the solder pads LP, preferably by galvanic deposition of a metal appropriately used for solder or an alloy, for example a lead/tin alloy. Since the structured second layer P2 serves as a template in the galvanic deposition, the method for the production of the bumps is self-aligning. Stencil printing for generating the bumps is also appropriate for bump dimensions between 50 and 100 $\mu$m. FIG. 5 shows the arrangement after the production of the bumps B. In addition, the SMD metallizations T, with the aid of which the substrate S can later be soldered to a circuit board, can still be produced at this stage of the method on the back side of the substrate S.

An electrical component, for example a surface wave component, is now soldered using the flip-chip technique onto the prepared substrate finished thusly. In addition, the piezoelectric chip C, which comprises on its top side the component structures in the form and electrically conductive structures L, is placed upon the bumps B with the component structures L facing the substrate S. In addition, the chip C comprises solderable metallizations on the (downward facing) surface that form the contact metallizations for the component structures L. The soldering is effected by melting the bumps B. The arrangement is shown in FIG. 6 in this stage with the surface wave component realized on the chip C. In addition, FIG. 6 shows a protective covering layer A, which is designated by the applicant as PROTEC, which is placed over the component structures as a cap. The covering layer A is preferably comprised of one of the borders R enclosing the component structures L, which simultaneously forms support and separation component for the covering layer A. In this manner, the component structures L are securely housed in an opening H between covering layer A and chip C.

Although a sufficient protection from environmental influences is given for the component structures by the PROTEC covering, the chip C can be covered even further by a protective layer SS. This lies on the back side of the chip C and terminates tightly with the upper or exposed surface of the second layer P2. The protective layer SS can be a multi-layer film laid over the component, as needed. However, it is also possible to produce the protective layer on the component by material deposition, and if necessary to structure it in the border areas. This can be supported when the undercut or space U is filled with a flow-capable filling compound between the border area of the chip C and the surface of the substrate S, on which the protective layer SS may be then applied in a simple manner, for example by vacuum deposition or sputtering of a metal.

FIG. 7 shows the component with the completed protective covering SS. Since all previous method steps were preferably implemented in the panel, in that a plurality of chips are mounted in a process step on a large-area substrate, the separation of the individual components can now ensue. FIG. 7 shows such an individual component which is effectively protected against environmental influences, in particular mechanical effects, humidity, dust, or chemicals. The total dimensions of the component are only slightly larger than the surface of the chip, are therefore exceedingly space-saving, and are designated by the applicant as CSSP (Chip Size SAW Package).

Although described only by a single exemplary embodiment, the invention is not limited to this. In particular, it is also possible to select a multi-layer composition for the substrate S, in that a plurality of the shown green films can be combined as needed under the intermediate arrangement of conductor path structures into a thicker multi-layer substrate. The composition of the metallization on the surface of the substrate also does not have to conform to the shown form. It is also possible to produce further metallization layers of any structure and thickness. This latter can serve for the better alignment of the solder pads upon which the bumps are finally produced in a self-aligning manner. The surface wave chip can comprise one or more PROTEC coverings, can however also be mounted on the substrate without this covering. Some components can also be processed, mounted, and protected in this manner, for example an IC or also a passive component. The protective layer SS can be one-layer or multilayered, whereby a metal layer can comprise one or more of these layers. Furthermore, it is possible to also cover the entire component above the protective layer SS with a cast resin or to extrusion-coat the entire component above the protective layer SS with a plastic compound, which serves to further protect the component.

We claim:

1. A component comprising a substrate having a chip mounted thereon, said substrate comprising at least one layer of a non-warping ceramic, said at least one layer having feedthroughs provided therein; a first metallization being arranged over each of the feedthroughs as a large-surface connection pad; the substrate and the connection pads facing the chip being covered with a photostructured layer, the photostructured layer having openings, each opening uncovering a part of the respective connection pad; under-bump metallizations, each under-bump metallization being provided by the uncovered part of the respective connection pad; and solder bumps being arranged on said under-bump metallizations, each solder bump being arranged in the respective opening of the photostructured layer, said solder bumps being selected from galvanically-deposited and currentless-deposited materials.

2. A component according to claim 1, wherein the separation between solder bumps is less than 75 μm.

3. A component according to claim 1, wherein the non-warping ceramic is an LTCC ceramic.

4. A component according to claim 1, wherein the non-warping ceramic is a ceramic having a low-warping during sintering, with a shrinkage after sintering being less than 0.1%.

5. A component according to claim 1, wherein the chip is a surface acoustical wave component being soldered over the solder bumps using a flip-chip technique.

6. A component according to claim 5, which includes a protective layer being selected from a single-layer and a multiple-layer film being laid over the acoustical wave component.

7. A component according to claim 5, which includes a protective layer being deposited over the surface acoustical wave component to form a protective layer.

* * * * *